United States Patent
Pelka et al.

(10) Patent No.: US 6,177,761 B1
(45) Date of Patent: Jan. 23, 2001

(54) LED WITH LIGHT EXTRACTOR

(75) Inventors: David G. Pelka, Los Angeles, CA (US); Roland Winston, Chicago, IL (US); William A. Parkyn, Jr., Lomita, CA (US)

(73) Assignee: Teledyne Lighting and Display Products, Inc., Hawthorne, CA (US)

( * ) Notice: Under 35 U.S.C. 154(b), the term of this patent shall be extended for 0 days.

(21) Appl. No.: 09/210,694

(22) Filed: Dec. 14, 1998

Related U.S. Application Data (63) Continuation-in-part of application No. 08/683,757, filed on Jul. 17, 1996, now abandoned.

(51) Int. Cl.⁷ ............................................... H01L 23/04
(52) U.S. Cl. ........................ 313/512; 313/499; 313/110; 362/800; 362/339
(58) Field of Search .................... 313/499, 512, 313/116, 110; 362/800, 339; 257/79

(56) References Cited

U.S. PATENT DOCUMENTS

| | | |
|---|---|---|
| 1,421,506 | 7/1922 | Limpert . |
| 3,863,075 | 1/1975 | Ironmonger et al. ................ 313/499 |
| 3,875,456 | 4/1975 | Kano et al. ........................... 313/110 |
| 3,915,148 | 10/1975 | Fletcher et al. . |
| 3,941,993 | 3/1976 | Hubert . |
| 3,970,070 | 7/1976 | Meyer et al. . |
| 4,002,031 | 1/1977 | Bell . |
| 4,022,186 | 5/1977 | Northrup, Jr. . |
| 4,074,704 | 2/1978 | Gellert . |
| 4,103,673 | 8/1978 | Woodworth et al. . |
| 4,108,540 | 8/1978 | Anderson et al. . |
| 4,116,223 | 9/1978 | Vasilantone . |
| 4,124,017 | 11/1978 | Paull . |
| 4,136,670 | 1/1979 | Davis . |
| 4,152,624 | 5/1979 | Knaebel ............................... 313/499 |
| 4,171,695 | 10/1979 | Sletten . |
| 4,194,949 | 3/1980 | Stark . |
| 4,337,759 | 7/1982 | Popovich et al. . |
| 4,755,921 | 7/1988 | Nelson . |
| 5,001,609 | 3/1991 | Gardner et al. ....................... 362/800 |
| 5,018,053 | * 5/1991 | Belknap et al. ..................... 362/800 |
| 5,087,949 | 2/1992 | Haitz ..................................... 257/79 |
| 5,140,220 | 8/1992 | Hasegawa ............................ 313/499 |
| 5,150,966 | 9/1992 | Nelson . |
| 5,255,171 | 10/1993 | Clark .................................... 362/800 |
| 5,274,536 | 12/1993 | Sato ..................................... 362/339 |
| 5,325,271 | 6/1994 | Hutchisson ........................... 313/116 |
| 5,404,869 | 4/1995 | Parkyn, Jr. et al. . |
| 5,567,037 | 10/1996 | Ferber ................................... 362/800 |

FOREIGN PATENT DOCUMENTS

| | | | |
|---|---|---|---|
| 1325086 | 8/1973 | (GB) | ................................ B60Q/7/00 |
| 1325087 | 8/1973 | (GB) | ................................ B60Q/7/00 |
| 1546791 | 5/1979 | (GB) | ............................... F21V/17/00 |
| 1546792 | 5/1979 | (GB) | .................................. F21S/9/02 |
| 1546793 | 5/1979 | (GB) | ............................... H01H/15/02 |
| 1557472 | 12/1979 | (GB) | .................................. F21M/5/02 |
| 1561129 | 2/1980 | (GB) | ............................... F21V/21/10 |
| 2239939 | 1/1993 | (GB) | ................................ B60Q/7/00 |
| 2239940 | 2/1993 | (GB) | ............................... F21V/17/00 |

* cited by examiner

*Primary Examiner*—Michael H. Day
(74) *Attorney, Agent, or Firm*—William W. Haefliger

(57) ABSTRACT

In apparatus to extract light from an LED, the combination includes a cylindrical body consisting of light transmitting material, the body having a cylindrical outer wall; a pyramidal body having at least three sides and consisting of light transmitting material, the pyramidal body located longitudinally endwise of the cylindrical body, to expose the three or more sides, the planar sides defining planes which intersect said cylindrical body outer wall at curved edges, the cylindrical outer wall terminating at said curved edges; and an LED located in a spaced relation to the pyramidal body, and oriented to transmit light in the cylindrical body and toward the pyramidal body.

14 Claims, 8 Drawing Sheets

| Parameter being Completed | 3-Sided Pyramidal Extractor | Hemispherical Aplanat Extractor |
|---|---|---|
| Efficiency | 90.4% (n=1.5) <br> 87.8% (n=1.8) | 84.1% (n=1.5) <br> 81.2% (n=1.8) |
| Al Metallic Reflector Losses (p = 0.88) | 8.6% (n=1.5) <br> 9.4% (n=1.8) | 12.4% (n=1.5) <br> 12.4% (n=1.8) |
| Fresnel Losses | 0.3% (n=1.5) <br> 1.8% (n=1.8) | 2.3% (n=1.5) <br> 4.7% (n=1.8) |
| System Diameter (mils) | 31 | 60 (n=1.5) <br> 75 (n=1.8) |
| System Height (mils) | 80 | 64 (n=1.5) <br> 72 (n=1.8) |
| Metal Cusp Diameter (mils) | 30.7 | 37 (n=1.5) <br> 35 (n=1.8) |
| Metal Cusp Height (mils) | 11 | 26 (n=1.5) <br> 23 (n=1.8) |
| RGB System diameter (mils) | 66.1 | 129 (n=1.5) <br> 161 (n=1.8) |
| RGB System Height (mils) | 172 | 107 (n=1.5) <br> 127 (n=1.8) |
| RGB Efficiency | 90.4% (n=1.5) <br> 87.8% (n=1.8) | 84.1% (n=1.5) <br> 81.2% (n=1.8) |
| Color Uniformity | Light Mixed and Uniformity Increased | Imaging Properties Causes Bright Spots |

LED WITH LIGHT EXTRACTOR

This application is a continuation-in-part application of prior U.S. patent application Ser. No. 08/683,757, filed Jul. 17, 1996, now abandoned.

This invention concerns efficient extraction of light from solid transparent media, and more particularly by the use of pyramidal structure.

Light produced inside a high index of refraction material may be trapped by total internal reflection. This is particularly true in a geometry of high symmetry, say a cube or parallelepiped. This poses a problem for light emitting diodes (LED's) where the index of refraction is very high, i.e. greater than three, so that only a small fraction of the light emerges. There is need for a means to enable a very large fraction of the light to emerge from LED associated transmission media, in order to significantly increase the efficiency of light transmission from LED's.

Various means have been suggested or actually used, to extract light by geometric means, but these are not particularly efficient. For example:

a) The LED can be embedded in a sphere of the same high index material. This is possible only for a point source at the emitter center and not for a finite size emitter. In addition, emerging light has large Fresnel reflection at the interface, $[(n-1)/(n+1)]^2$ which is ≈25% for n=3.

b) An aplanatic lens, which is a hemisphere of radius r with conjugates at r/n and nr, has been used to collimate the light within the Brewster Angle in an attempt to reduce Fresnel reflections. Typically, the material has index n≈1.5, so that much of the light, i.e. over 16%, remains trapped in the aplanatic lens, because of its high (rotational) symmetry. By keeping all reflections at angles inside the Brewster's Angle, losses are relatively small, but the tradeoff is a much greater system size than the actual LED.

SUMMARY OF THE INVENTION

It is a major object of the invention to provide an improved LED light extraction means embodying a pyramidal configuration. Basically, the extraction means comprises:

a) a cylindrical body consisting of light transmitting material, the body having a cylindrical outer wall, b) a pyramidal body having at least three planar sides and consisting of light transmitting material, the pyramidal body located longitudinally endwise of the cylindrical body, to expose the three or more sides, the planar sides defining planes which intersect the cylindrical body outer wall at curved edges, the cylindrical outer wall terminating at such curved edges, c) LED means located in spaced relation to the pyramidal body, and oriented to transmit light in the cylindrical body and toward the pyramidal body.

Such a device can attain efficiencies in excess of 90% in transferring light from a higher index of refraction material into air. Also, such a device is much more compact than the aplanatic device.

Comparison of the two systems shows that the monochrome LED aplanat system is somewhat larger in diameter and has no ability to mix together light from an RGB LED triad, because the aplanat system is an imaging system whereas the LED pyramidal extractor is non-imaging and therefore a good RGB mixer. The new three-sided pyramidal extractor disclosed herein has almost no losses due to Fresnel reflections, which are themselves extracted. While a 3-sided pyramidal structure is a preferred configuration, one with more than 3 sides is also effective. Additionally, an RGB (red, green, blue) extractor system that varies its color balance can be made very compactly. Three LEDs, each emitting at a specific wavelength or color, can be combined into one extractor system that can change color output by independently varying the emission of each LED. In this regard, the aplanat system of prior art requires a system diameter at least twice the diameter of the pyramidal extractor. Also, the present pyramidal system design is independent of the index of refraction within the extractor.

A further object of the invention is to provide an improved apparatus to extract light from multiple LEDs. The apparatus comprises:

a) a transparent body having a first region in which the LED's are at least partly received, b) the body having a second region in the paths of light transmission from the LEDs, and acting to mix such light transmission, c) the body having a third region in the path of light transmission from the second region, the third region being of reduced volume from which mixed light is transmitted, d) the second region having cylindrical surface shape between surface areas which are continuations of planes defined by sides of said third pyramid region.

As referred to above, the third region may preferably have pyramidal shape, the second region may have conical shape, and the first region may have cylindrical shape. In this regard, the second region typically has surfaces that are continuations of planes defined by the sides of the third pyramid region. Three LED's may be employed, in a cluster, and may, for example, respectively be red, green and blue light emitting, and there may be means for controlling the relative emissions from the LEDs, for color control of the mixed light transmitted from the third region.

These and other objects and advantages of the invention, as well as the details of an illustrative embodiment, will be more fully understood from the following specification and drawings, in which:

DETAILED DESCRIPTION

Figure 1:
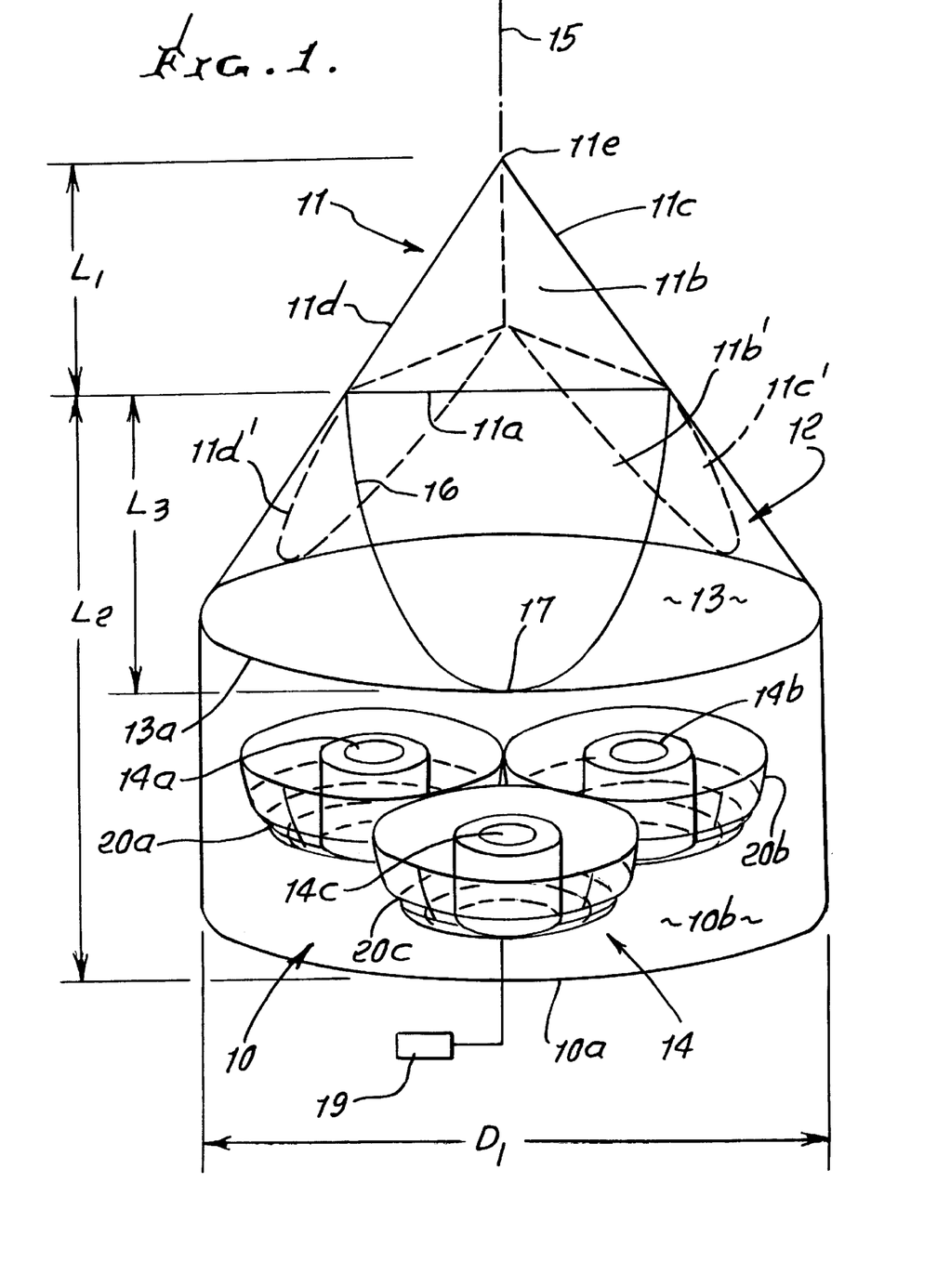
FIG. 1 is a perspective view of a pyramidal light extractor incorporating the invention.

Referring first to FIG. 1, a cylindrical body 10 of height $L_2$–$L_3$ consists of light transmitting material such as thermosetting polymer, UV curable polymer or injection moldable material such as acrylic or polycarbonate, all of the foregoing materials with a common index of refraction in the 1.5 to 1.6 range. That body has a bottom 10a and a cylindrical side wall 10b. As shown, the body diameter $D_1$ generally is less than the axial height or length $L_1+L_3$. A pyramidal body 11 of height $L_1$ is located above the upper side of body 10, and is shown as having a base 11a, and three sides 11b, 11c and 11d, and tip 11e. Base 11a is spaced above the plane of the top of body 10, typically halfway between said tip 11e and the horizontal plane indicated at 13a.

Body 11 also consists of light transmitting material, which may be the same as that of body 10. A third body 12 of height $L_3$ is located between bodies 10 and 11, and may be unitary or integral therewith, whereby only one overall body is provided, having first, second and third body regions 10, 11 and 12. The overall body may consist of plastic material, such as thermosetting polymer or UV curable polymers.

LED means generally is shown at 14, located in body 10 in spaced relation to the pyramidal body region 11, and oriented to transmit light in body 10 and toward body 11, for example through region 12. Region 12 may be characterized as acting to mix light transmission of different wavelengths, from multiple LEDs, and body 11 may be characterized as in the path of light transmission from region 12, body 11 being of reduced volume, and from which light is efficiently transmitted into the surrounding air.

Second body region 12 typically has modified cylindrical shape, i.e. with a wall 13 that is a continuation of cylindrical side wall 10b, and with a circular base indicated at 13a coincident with or integral with the upper side of body 10. If bodies 10 and 12 are integral, as is preferred, then the top of 10 and the base of 12 are unitary, i.e. no physically coincident surfaces exist, and the bodies 10, 11 and 12 may then be unitary and homogeneous. Wall 13 is cylindrical between planar surface areas 11b', 11c' and 11d' which are downward continuations of the body 11 pyramid planes 11b, 11c and 11d, respectively. Planes 11b', 11c', and 11d' are alike, and spaced equidistantly about the vertical axis 15 of the overall body; also, those planes intersect the cylindrical surface 13 along elliptical section lines 16 that are curved, and tangent at 17 to the upper edge circle 13a defined by the uppermost full horizontal extent of the body 10. Line 13a also shows a plane defined by tangent points 17.

Figure 8:
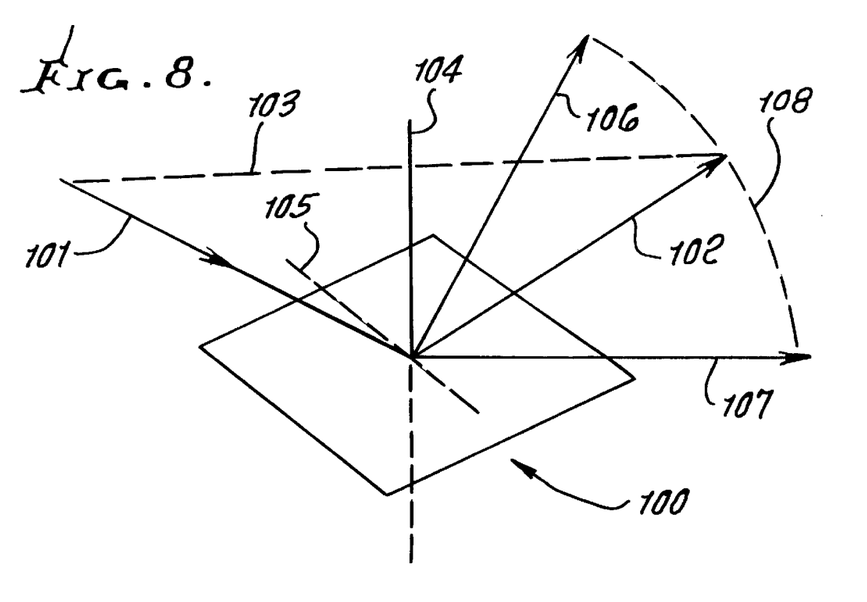
FIG. 8 is a diagram.
Figure 9:
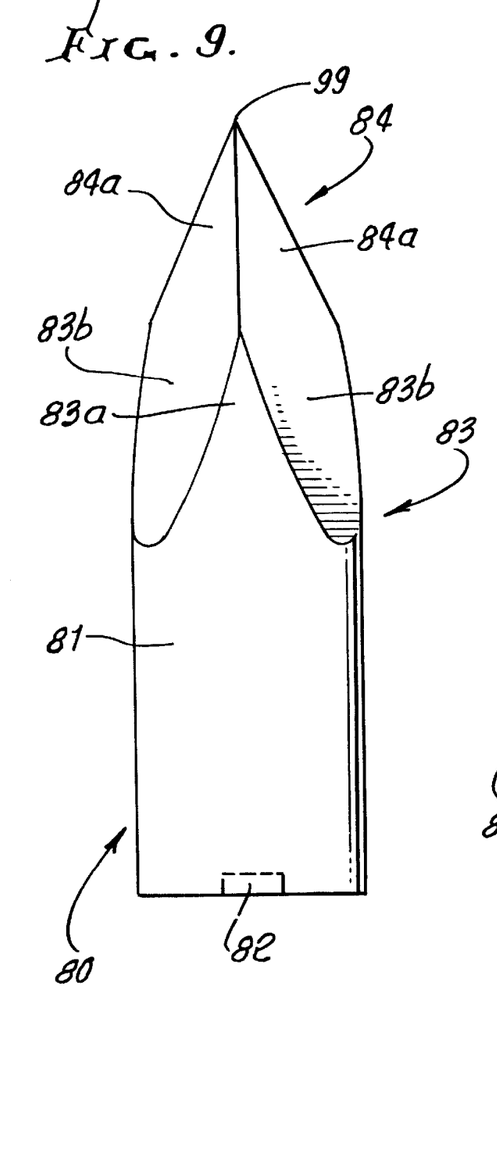
FIG. 9 is a side elevation showing a modification.
Figure 10:
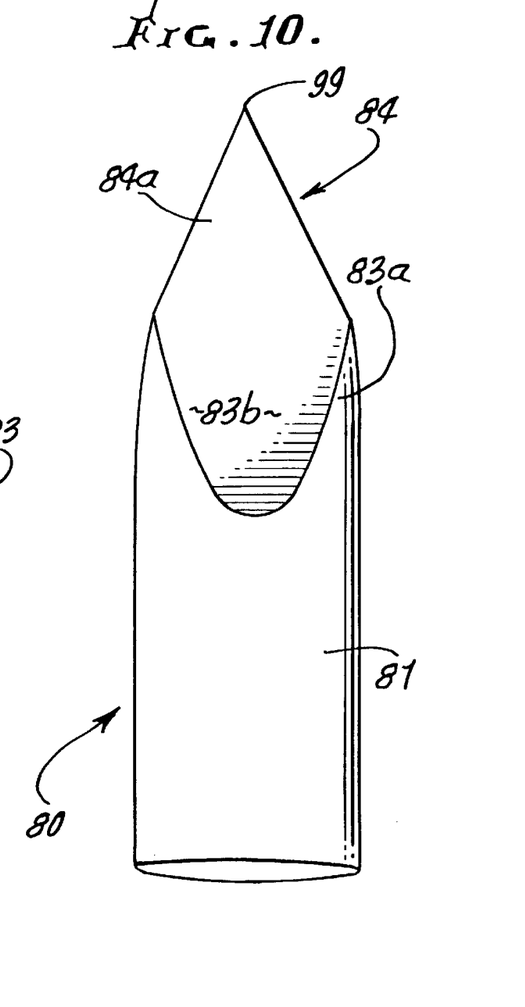
FIG. 10 is a view like FIG. 9, but taken toward one flat side of the body upper portion.
Figure 11:
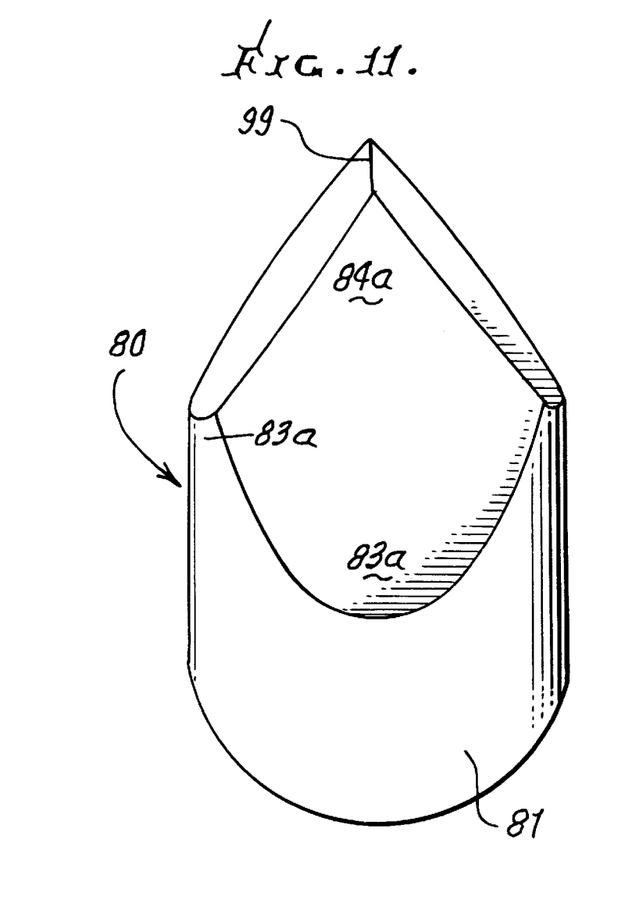
FIG. 11 is a view like FIG. 10, but taken edgewise of the one flat side of the body upper portion.
Figure 12:
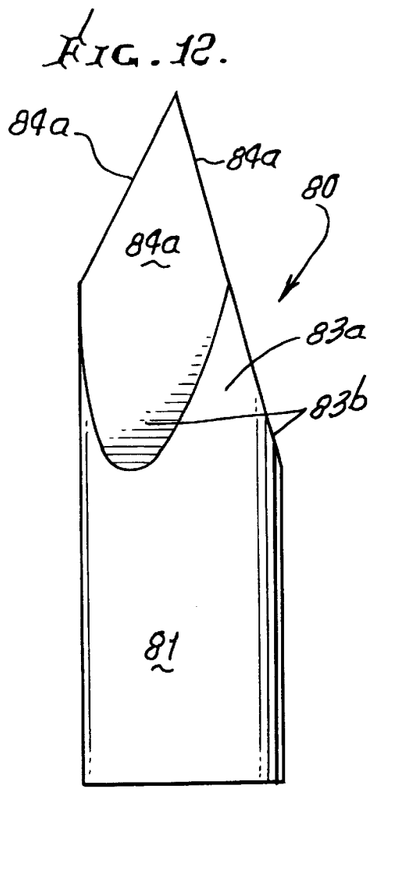
FIG. 12 is a perspective view of the FIG. 9 modification.
Figure 13:
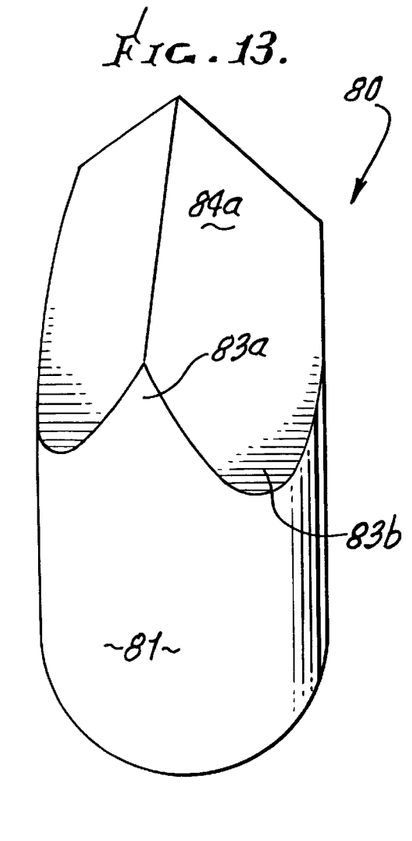
FIG. 13 is a top perspective view of the FIG. 9 modification.
Figure 14:
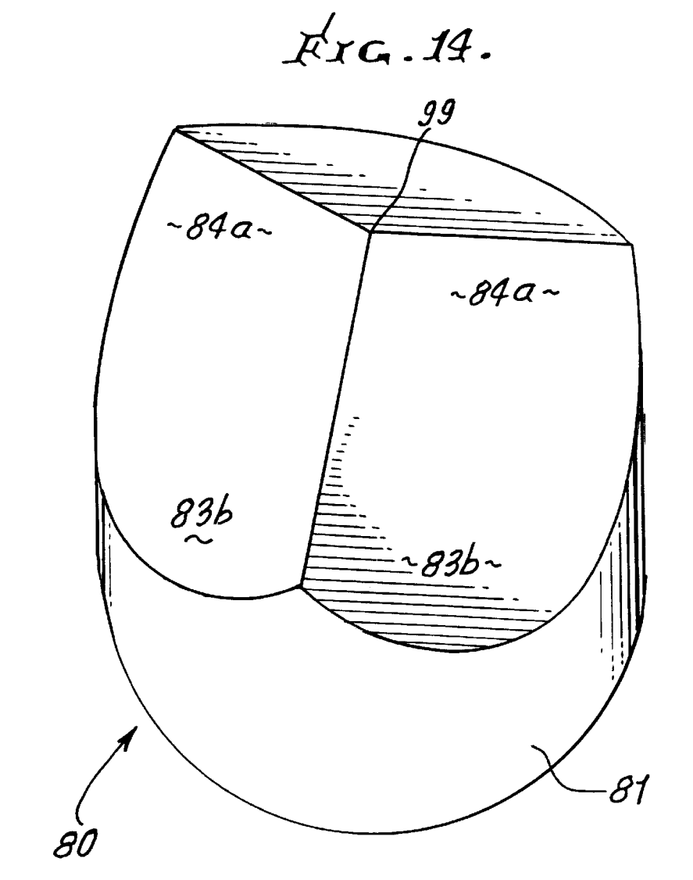
FIG. 14 is a top side perspective view of the FIG. 9 modification.
Figure 15:
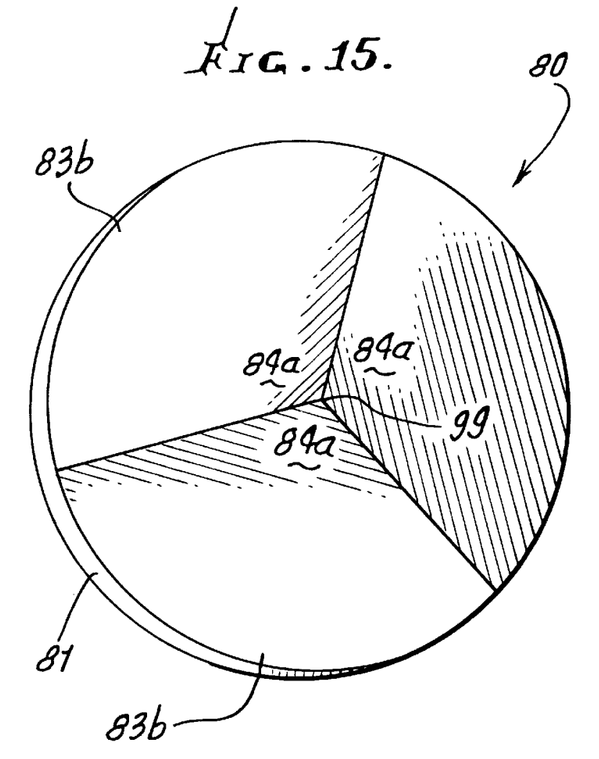
FIG. 15 is another top and side perspective view of the FIG. 9 modification.

A variation of this invention includes micro-optical means on some or all surfaces whereby total internal reflection is laterally scattered. That is, an internally reflected ray will continue upwards but will be fanned out into a sheet of rays, thereby promoting mixing. Conventional scattering means would send too much energy back down the extractor, to be lost. Instead, a holographic diffuser with a narrow elliptical scattering pattern oriented circumferentially on the extractor would help mix the colors. In FIG. 8 a small portion of a surface is shown, with tangent plane 100. Tangent plane 100 reflects ray 101 into ray 102. Both said rays lie in plane 103, which is orthogonal to plane 100, and contains surface normal 104. Line 105 indicates a circumference of the invention. Scattered rays 106 and 107 form plane 108, which is orthogonal to plane 103. Said scattered rays form the limiting angles of a fan of rays into which ray 102 is smeared. Plane 100 could either have a circumferentially oriented elliptical-patterned holographic diffuser or a diffraction grating to implement the scattering pattern.

Figure 2:
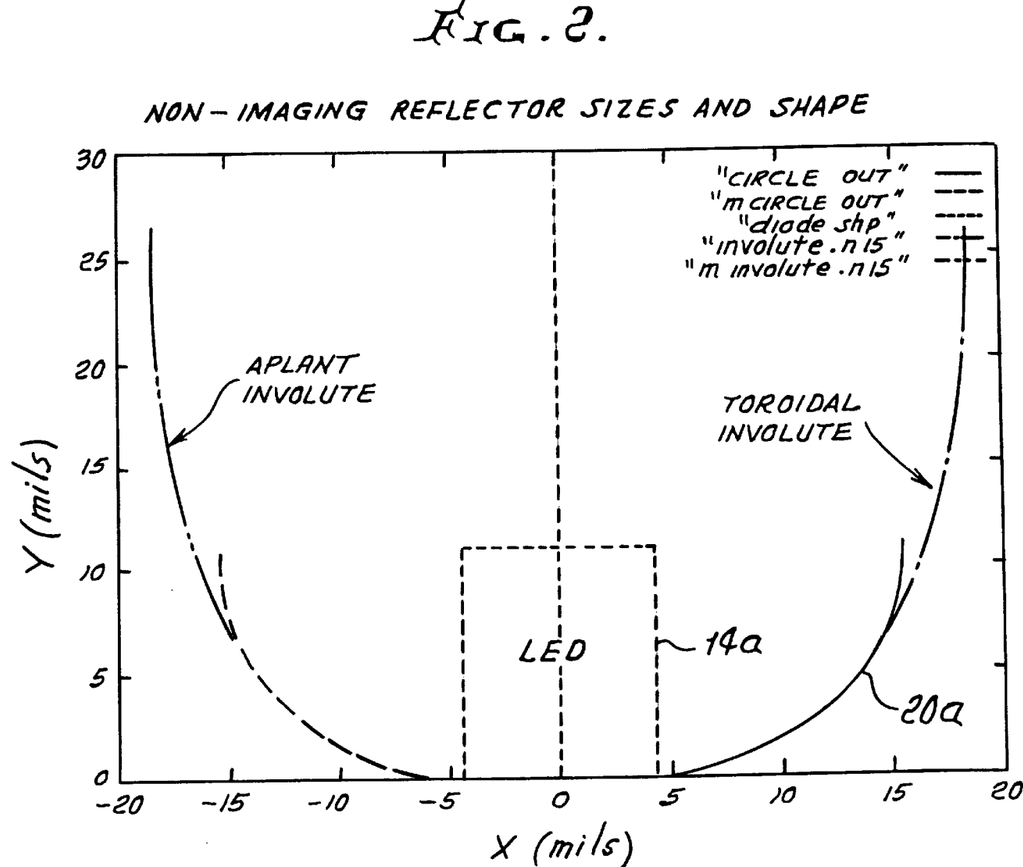
FIG. 2 is a graph.
Figure 3:
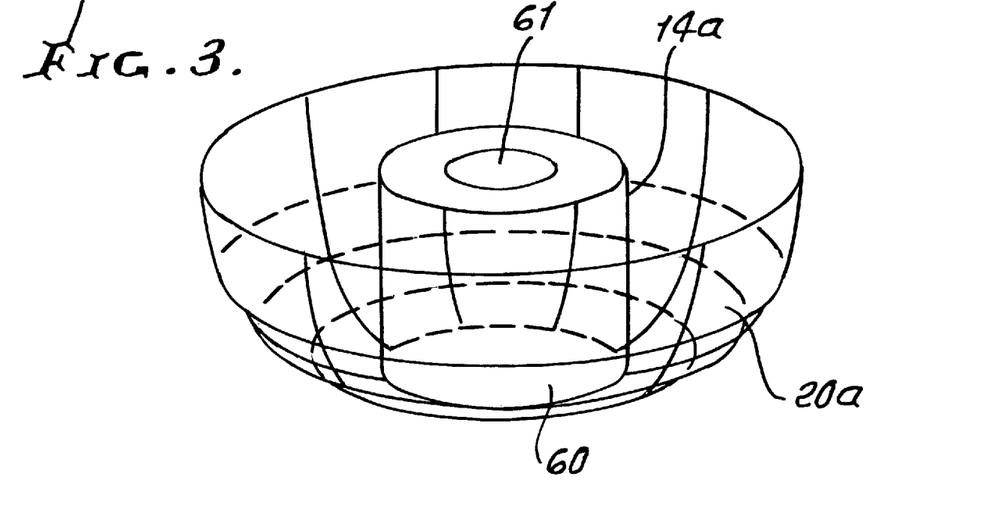
FIG. 3 is a perspective view of an LED mounted within a reflector.

Also, provided are generally non-imaging reflector means associated with the one or more LED means 14. As shown, there are three LEDs, in a cluster, at 14a, 14b and 14c. They may be cylindrical as shown or rectangular. They may be red, green and blue light emitting LEDs, and means to control the relative levels of light transmission from the LEDs is shown at 19. FIGS. 1 and 3 show the LEDs as centered within the cup-like reflectors 20a, 20b and 20c, which may consist of aluminum shells, with about 0.88 reflectivity. FIG. 2 shows the dimensions of a typical reflector, having a toroidal elliptical surface. The reflector is non-imaging, and acts to reflect light upwardly with a maximum angle such that no light passes through cylinder walls 10b or 13. The material of body 10 fills the cup formed by each reflector, about the LED in that cup.

The geometry of the pyramidal extractor is depicted in FIG. 1 and is formed by taking a cylinder with diameter D and shaving off three planes. The geometry of the planes is described by two lengths $L_1$ and $L_3$. The length of the pyramidal region is $L_1$, while the total length of the extractor is $L_1+L_2$ ($L_2$ is the length of the extractor surface that contains parts of the original i.e. lower cylinder). Each plane is determined by three points that are the vertices of triangle 11a. All planes share a common point at the tip $(0,0,L_1+L_2)$. The other points for the $i^{th}$ plane (i=1,2,3) are $(R\cos(2\pi i)/3, R\sin(2\pi i)/3, L_2)$ and $(R\cos(2\pi(i+1))/3, R\sin(2\pi(i+1))/3, L_2)$, where $R=D/2$ is the cylinder radius. In order for the cylindrical region in FIG. 1 to have a finite length (and allow the extractor to be coupled to a circular aperture), the condition $L_2 > L_1$ must be satisfied. When $L_1 = L_2$, the faces 11b', 11c', and 11d' are coplanar with faces 11b, 11c, and 11d, respectively. In the FIG. 1 design, the metal reflector cusp and LED (depicted in FIG. 4) are embedded inside the cylindrical region 10, which has height $L_2$–$L_3$.

Figure 5:
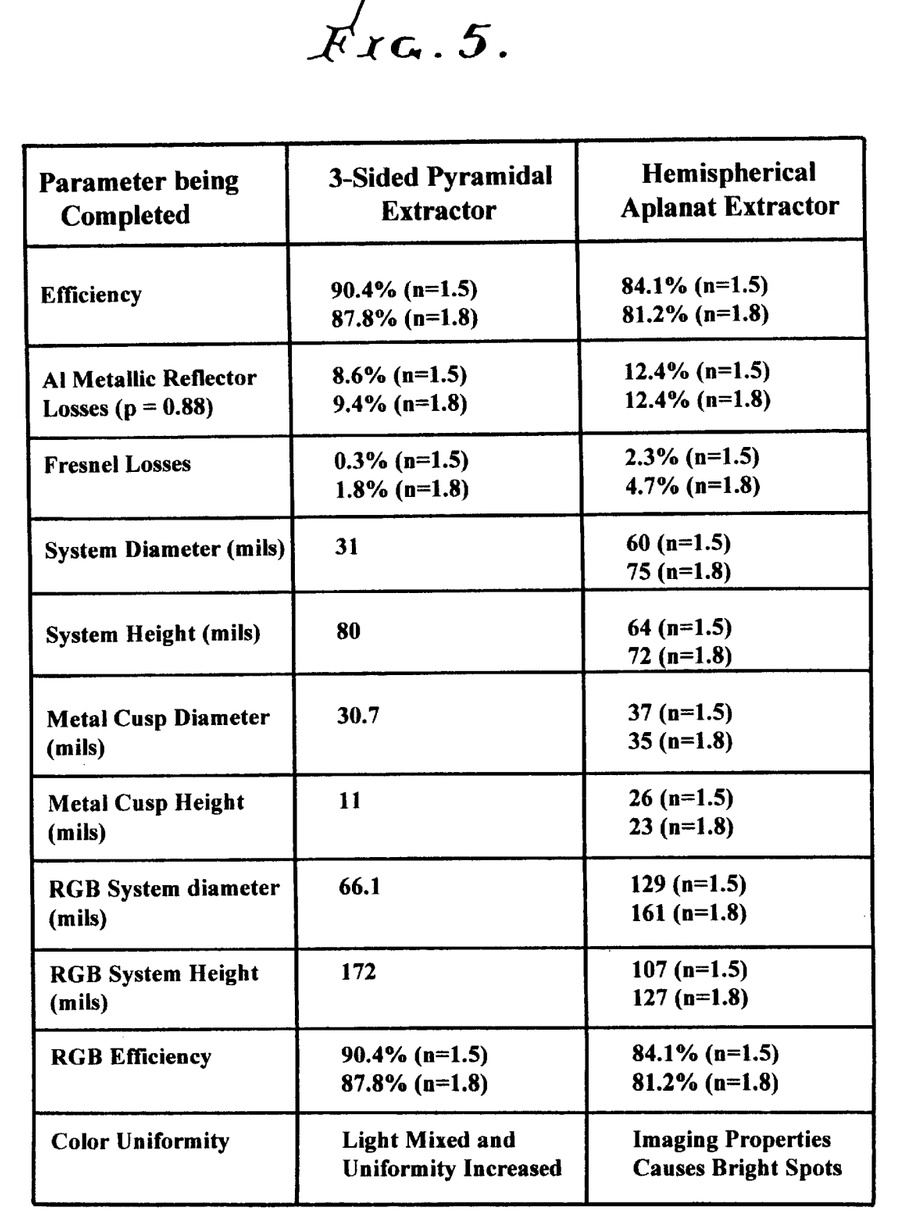
FIG. 5 is a tabulation.

FIG. 5 is a summary table comparing the performance of the present pyramidal extractor with the hemispherical aplanat system of the prior art. Only light rays exiting with a positive direction vertically are considered extracted, resulting in a loss of around 1% for both systems.

As respects operation, consider a pyramidal structure of high index of refraction material and low symmetry, say 3-sided. Even if the light distribution is hemispherical at the base, essentially all of the light will emerge or be turned back by phase space conservation. In a situation of high symmetry, say rotational symmetry, the skew invariant will cause much of the light to turn back. But in a situation of low symmetry such as a 3-sided pyramid, there is no invariance principle that requires rays to turn back, and by varying the taper angle as an adjustable parameter, essentially none of the light is turned back. It is important to note that the fraction of light extracted considerably exceeds even that of a single Fresnel reflection, because of multiple reflections inside the extractor. Therefore, essentially all of the light is extracted.

Ideally, the extractor will be of the same index material as and in optical contact with the LED material. If made of a lesser index material, say n≈1.5, at least all of the light already inside the n≈1.5 material will emerge. This is significantly better than achieved by current practice.

Pyramidal extractors have been proposed and used for high flux solar energy concentration. The Weizmann Institute of Science group in Rethoven, Israel (Amnon Yogev, Harald Ries, A. Segal and Jacob Karni) has used them in conjunction with dielectric CPC nonimaging cones for a high temperature receiver in a solar furnace. The University of Chicago group (Roland Winston, David Jenkins, Joe O'Gallagher) has used them in conjunction with dielectric CPC nonimaging cone in a solar furnace to achieve a concentration of 50,000 suns.

The radiation pattern at an LED surface can be deduced by considering the LED inside a cavity with index n≈1 in equilibrium with its own radiation. Then applying the Kirchoff relations, the emissivity $$\epsilon_e(\theta, \pi)$$
$$\epsilon_e(\theta, \pi) = \mathcal{A}(0, \pi) = 1 - \rho(\theta, \pi).$$

Here, $\mathcal{A}(0, \pi)$ is the absorptivity, θ is the angle with respect to the surface normal of the LED and π is the polarization. Dependence on other variables such as wavelength λ has been suppressed. Now ρ(0, π) is just the Fresnel reflection coefficient at the n≈1, n≈3 interface, which is $[(n-1)/(n+1)]^2$. This formula can be found, for example in Born and Wolf, Principles of Optics ($6^{th}$ edition, page 40). It follows that the angular distribution can be modeled as:

$$dN/d\Omega = \alpha\cos\theta[1-\rho(\theta, \pi)]$$

where Ω is the solid angle of emission.

This means that the angular distribution is more peaked in the forward direction than a simple lambertian distribution (αcosθ). This result is expected to closely model an ergodic situation such as the regular volume of, an LED, but not the extractor, where the light distribution is best obtained by detailed ray-tracing.

Figure 4:
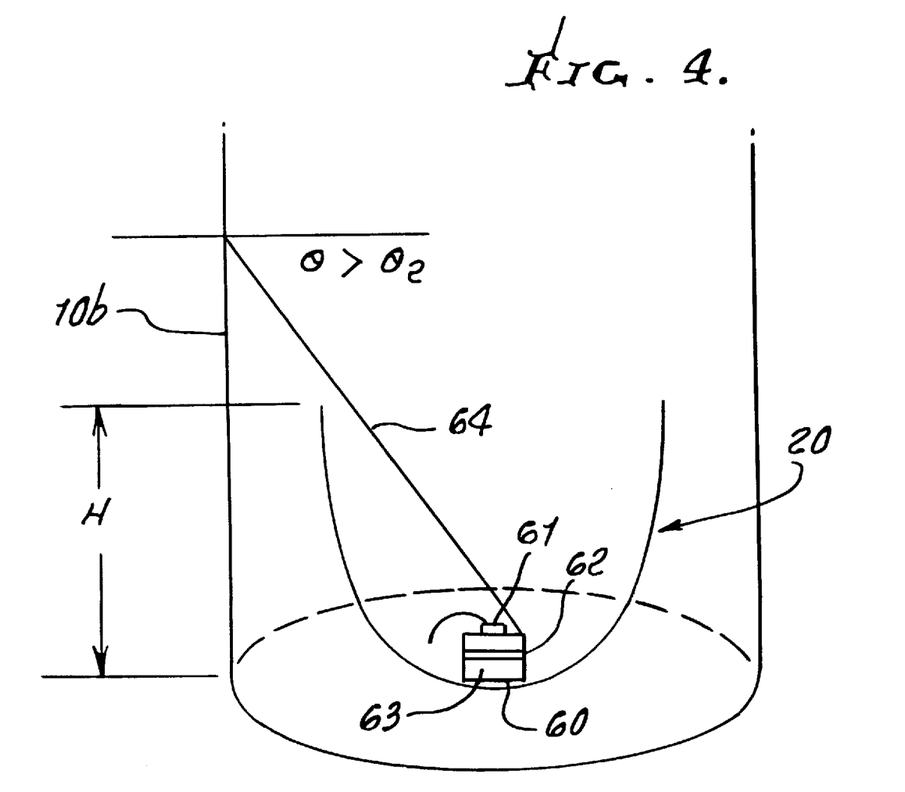
FIG. 4 is a section taken in elevation through the FIG. 3 reflector and showing the centered LED.

The LEDs are typically formed as cubes, each having a bottom conductor layer (cathode) as at 60 in FIG. 4, a top anode 61, an intermediate PIN junction 62, and body 63. LED compositions determine the color of emitted light. LEDs are known, and supplied by companies such as Hewlett Packard Corp., Toshiba Corp. and Sony Corp. The reflectors as described are typically thin metallic stampings.

Figure 6:
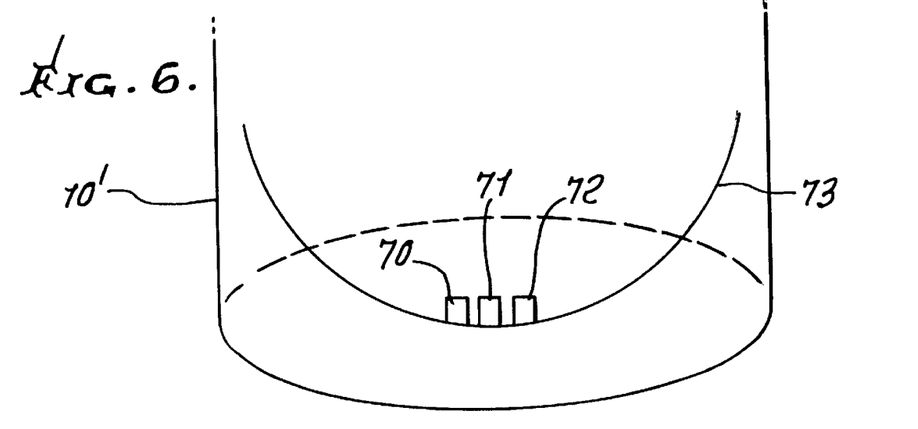
FIGS. 6 and 7 are elevations showing modifications.

As shown in FIG. 4, depicting only one of the three RGB LED's in body 10, the height H of the reflector cup, above the level of the bottom of the LED cube, must be such that the extreme rays 64 from the LED reach the cylindrical wall 10b of body 10 at an angle θ that is greater than $\theta_c$= arcsin (1/n), which is the critical angle for total internal reflection. $\theta_c$=42° for n=1.5. Thus, all light or essentially all light from the three RGB LEDs is reflected back into, and upwardly, in body 10 for mixing by multiple reflections off the walls of 10, 11 and 12, to eventually exit the top pyramid. FIG. 6 shows three LEDs 70, 71, and 72 (red, green and blue light emitting) placed in one hemispherical reflector 73, all embedded in cylindrical body 10' (below regions 11 and 12, as before), to produce light mixing.

Figure 7:
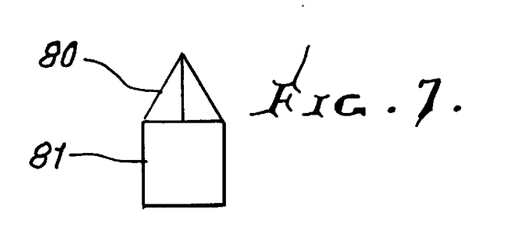

FIG. 7 shows another modification, wherein a three-sided light transmitting pyramid 80 is located at the top of an LED 81, for transmitting light upwardly. It is preferable that the LED substrate have relatively low absorption, so as to allow the extractor pyramid sufficient optical path length for efficient transmission outwards.

In the modifications shown in FIGS. 9–15, the elements corresponding to those of FIG. 1 bear the same identifying numerals.

The apparatus shown in FIGS. 9–15, as in FIG. 1, includes or comprises:

a) a cylindrical body consisting of light transmitting material, said body having a cylindrical outer wall, b) a pyramidal body having at least three planar sides and consisting of light transmitting material, said pyramidal body located longitudinally endwise of said cylindrical body, to expose said three or more sides, said planar sides defining planes which intersect said cylindrical body outer wall at curved edges, said cylindrical outer wall terminating at said curved edges, c) LED means located in spaced relation to said pyramidal body, and oriented to transmit light in said cylindrical body and toward said pyramidal body.

The apparatus shown in FIGS. 9–15, as in FIG. 1, also may be defined to comprise:

a) a transparent body 80 having a first region 81 which is cylindrical and in which the LED's 82 are at least partly received, b) said body having a second and upper region 83 in the upward paths of light transmission from the LEDs, and acting to mix such light transmission, c) said body 80 having a third uppermost region 84 in the path of light transmission from the second region, said third region being of reduced volume from which mixed light is transmitted, d) said second region having a discontinuous cylindrical surface shape at 83a between planar surface areas 83b which are downward continuations of three planes 84a defined by sides of said third region, which has three-sided pyramid form, e) said planar surface areas 83b intersecting said surface 83a along curved lines which are portions of ellipses.

The body apex appears at 99. The apparatus of FIGS. 9–15 performs the same functions as does the FIGS. 1–8 apparatus.

From the foregoing and the drawings, it will be noted that the light transmitting pyramid sides define planes extending upwardly toward an apex that is spaced in a longitudinal direction from the LED, those planes steeply angled, at angles in excess of 45°, relative to a lateral plane normal to said longitudinal direction such that essentially all LED light incident on said three sides from within the pyramid is extracted from said sides.—See for example the planar angularities in FIGS. 1 and 9–13.

We claim:

1. In apparatus to extract light from an LED, the combination comprising a) a cylindrical body consisting of light transmitting material, said body having a cylindrical outer wall, b) a pyramidal body having at least three planar sides and consisting of light transmitting material, said pyramidal body located longitudinally endwise of said cylindrical body, to expose said three or more sides, said planar sides defining planes which intersect said cylindrical body outer wall at curved edges, said cylindrical outer wall terminating at said curved edges, c) LED means located in spaced relation to said pyramidal body, and oriented to transmit light in said cylindrical body and toward said pyramidal body, d) said planes extending upwardly toward an apex that is spaced In a longitudinal direction from the LED means, said planes angled in excess of 45° relative to a lateral plane normal to said longitudinal direction such that essentially all LED light incident on said sides from within the pyramid is extracted.

2. The combination of claim 1 wherein said LED means is located within reflector means, in alignment with said pyramidal body.

3. The combination of claim 2 wherein the reflector means has a height H characterized in that extreme rays from the LED means in the reflector means are reflected by a wall or walls associated with a body region or regions, back into the body region or regions.

4. The combination of claim 3 wherein each LED is located in a separate reflector in the form of a cup.

5. In apparatus to extract light from multiple LEDs, the combination comprising
   a) a transparent body having a first cylindrical region in which the LED's are at least partly received,
   b) said body having a second region in the paths of light transmission from the LEDs, and acting to mix such light transmission,
   c) said body having a third region in the path of light transmission from the second region, said third region being of reduced volume from which mixed light is transmitted,
   d) said second region having discontinuous cylindrical surface shape between planar surface areas which are continuations of three planes defined by sides of said third region.

6. The combination of claim 5 wherein said third region has pyramid shape.

7. The combination of claim 5 wherein said third region has pyramid shape.

8. The combination of claim 5 wherein said planes meet at an apex.

9. The combination of claim 8 wherein said first region has a height $L_2-L_3$ and said second and third regions have heights $L_3$ and $L_1$, respectively, and where $L_2>L_1$.

10. The combination of claim 5 wherein there are three of said LEDs, in a cluster.

11. The combination of claim 10 including cup-shaped reflector means that include three cups which are clustered and open toward said second region, the three LEDs located respectively in said cups.

12. The combination of claim 5 including means for controlling the relative emissions from the LEDs.

13. The combination of claim 5 wherein said LEDs are located within reflector means, in alignment with the pyramidal body, and said reflector means and LEDs are both located at least partly within said body.

14. The combination of claim 5 wherein said three LEDs emitting red, green and blue light are located within one reflector in the form of a cup.

* * * * *